: US007842981B2

United States Patent
Lee et al.

(10) Patent No.: US 7,842,981 B2
(45) Date of Patent: Nov. 30, 2010

(54) SEMICONDUCTOR DEVICE AND METHOD OF MANUFACTURING THE SAME

(75) Inventors: Hong-Ji Lee, Incheon (KR); Sung-Jin Kim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 191 days.

(21) Appl. No.: 12/219,415

(22) Filed: Jul. 22, 2008

(65) Prior Publication Data

US 2009/0026547 A1    Jan. 29, 2009

(30) Foreign Application Priority Data

Jul. 23, 2007    (KR) ...................... 10-2007-0073347

(51) Int. Cl.
    *H01L 27/148*    (2006.01)
(52) U.S. Cl. ........................ 257/249; 257/288; 257/368; 257/E29.135; 257/E29.136; 257/E29.152
(58) Field of Classification Search ................. 257/249, 257/288, 368, 387, E29.007, E29.111, E29.112, 257/E29.134, E29.135, E29.136, E29.15, 257/E29.152
See application file for complete search history.

(56) References Cited

U.S. PATENT DOCUMENTS

2007/0029619 A1*    2/2007    Kim et al. ................... 257/368

FOREIGN PATENT DOCUMENTS

| KR | 10-0608374 B1 | 7/2006 |
| KR | 10-2006-0105161 A | 10/2006 |
| KR | 10-2007-0016860 A | 2/2007 |

* cited by examiner

*Primary Examiner*—Matthew E Warren
(74) *Attorney, Agent, or Firm*—Lee & Morse, P.C.

(57) ABSTRACT

A semiconductor device includes an active region extending along a first direction on a semiconductor substrate, the active region having a first sidewall and a second sidewall spaced apart and facing each other, a distance between the first and second sidewalls extending along a second direction, and a gate on the active region, the gate having a pair of body portions extending along the second direction and being spaced apart from each other, the second direction being perpendicular to the first direction, a head portion extending along the first direction to connect the body portions, the head portion overlapping a portion of the first sidewall, and a plurality of tab portions protruding from sidewalls of the body portions, the tab portions extending along the first direction and overlapping a portion of the second sidewall.

7 Claims, 6 Drawing Sheets

SEMICONDUCTOR DEVICE AND METHOD OF MANUFACTURING THE SAME

BACKGROUND OF THE INVENTION

1. Field of the Invention

Example embodiments of the present invention relate to a semiconductor device and a method of manufacturing the semiconductor device. More particularly, example embodiments of the present invention relate to a semiconductor device having an improved structure of gate edges and a method of manufacturing the semiconductor device.

2. Description of the Related Art

Generally, a semiconductor device, e.g., a switching element, may be formed on a semiconductor substrate by a series of processes. For example, a layer may be formed on a semiconductor substrate, and a photolithography process may be used to form an etching mask, e.g., photoresist patterns, on the layer. Then, the layer may be etched, e.g., an anisotropic etching process or an isotropic etching process, through the etching mask, so the layer or portions of the substrate may be transformed into patterns having specific characteristics.

A conventional photolithography process may include an exposure process, e.g., use of optical equipment for transcribing predetermined image patterns on a photoresist layer. The resolution and depth of focus when forming the predetermined image patterns may depend on a wavelength of light and a diameter of a projection lens in the optical equipment. In particular, as unit cell areas become smaller and integration degree of semiconductor devices increases, sizes of the predetermined image patterns formed by the photolithography process may decrease, i.e., very fine patterns.

Use of the conventional photolithography process to form very fine patterns, however, may cause inconsistent edge sizes. In particular, edge portions of fine patterns formed via the photolithography process may be formed to be smaller than their corresponding theoretical values due to light interference or a difference in an etching amount. When inconsistent edge sizes of a mask are sued to form a gate, edges of the gate may be smaller than an expected size, thereby increasing leakage current. As a result, resistance to a punch-through phenomenon due to hot carrier electrons may be reduced in the semiconductor device.

SUMMARY OF THE INVENTION

Embodiments of the present invention are therefore directed to a semiconductor device and a method of manufacturing the same, which substantially overcome one or more of the disadvantages and shortcomings of the related art.

It is therefore a feature of an example embodiment of the present invention to provide a semiconductor device having an improved structure of gate edges and a high degree of integration.

It is another feature of an example embodiment of the present to provide a method of manufacturing a semiconductor device having an improved structure of gate edges and a high degree of integration.

At least one of the above and other example embodiments of the present invention may provide a semiconductor device, including an active region extending along a first direction on a semiconductor substrate, the active region having a first sidewall and a second sidewall spaced apart and facing each other, a distance between the first and second sidewalls extending along a second direction, and a gate on the active region, the gate having a pair of body portions extending along the second direction and being spaced apart from each other, the second direction being perpendicular to the first direction, a head portion extending along the first direction to connect the body portions, the head portion overlapping a portion of the first sidewall, and a plurality of tab portions protruding from sidewalls of the body portions, the tab portions extending along the first direction and overlapping a portion of the second sidewall.

The head portion may overlap the active region. The semiconductor device may further include a gate insulation layer pattern between the active region and the gate. The semiconductor device may further include first and second source/drain regions at an upper portion of the active region, the first source/drain region being between the pair of the body portions, and the second source/drain region being adjacent to an isolation layer surrounding the active region. The semiconductor device may further include first contacts on the first and second source/drain regions and a second contact on the head portion of the gate. Two tab portions may protrude from each body portion, the two tab portions being positioned on opposing sidewalls of the body portion. Each body portion with the two tab portions may be symmetrical about a central axis crossing the body portion along the second direction.

At least one of the above and other example embodiments of the present invention may provide a method of manufacturing a semiconductor device, including forming an active region extending along a first direction on a semiconductor substrate, the active region having a first sidewall and a second sidewall spaced apart and facing each other, a distance between the first and second sidewalls extending along a second direction, forming a gate on the active region, to have a pair of body portions extending along the second direction and being spaced apart from each other, the second direction being perpendicular to the first direction, a head portion extending along the first direction to connect the body portions, the head portion overlapping a portion of the first sidewall, and tab portions protruding from sidewalls of the body portions, the tab portions extending along the first direction and overlapping a portion of the second sidewall. The method may further include forming a gate insulation layer pattern between the active region and the gate. The method may further include forming a first source/drain region and a second source/drain region in an upper portion of the active region by ion implantation, the first source/drain region being between the pair of the body portions, and the second source/drain region being adjacent to an isolation layer surrounding the active region. The method may further include forming first contacts on the first and the second source/drain regions, and forming a second contact on the head portion of the gate.

At least one of the above and other example embodiments of the present invention may provide a method of manufacturing a semiconductor device, including forming an active region extending along a first direction on a semiconductor substrate, the active region having a first sidewall and a second sidewall spaced apart and facing each other, a distance between the first and second sidewalls extending along a second direction, forming a gate insulation layer on the active region, forming a gate conductive layer on the gate insulation layer, forming a mask on the gate conductive layer, the mask including a pair of first portions, a second portion, and a plurality of third portions, the pair of first portions being spaced apart from each other and extending along the second direction, the second direction being perpendicular to the first direction, the second portion extending along the first direction to connect the first portions to each other, the second portion covering a portion of the first sidewall, each of the third portions protruding from sidewalls of each of the first portions, the third portions extending along the first direction and covering a portion of the second sidewall, etching the gate conductive layer using the mask as an etching mask to form a gate, performing an ion implantation process using the mask as an ion implantation mask to form first and second source/drain regions at an upper portion of the active region, and removing the mask.

Forming the gate may include forming a pair of body portions extending along the second direction and being spaced apart from each other, forming a head portion extending along the first direction to connect the body portions, the head portion overlapping a portion of the first sidewall, and forming tab portions protruding from sidewalls of the body portions, the tab portions extending along the first direction and overlapping a portion of the second sidewall. The method may further include forming an isolation layer on the semiconductor substrate to surround the active region, and etching the gate insulation layer using the mask as an etching mask to form a gate insulation layer pattern beneath the gate. Forming the mask may include using a photolithography process. The method may further include forming first contacts on the first and the second source/drain regions, and forming a second contact on the head portion of the gate. Forming the first contacts and the second contact may include forming an insulation layer on the first source/drain region, second source/drain region, and gate, etching the insulation layer to form first holes exposing the first and second source/drain regions, and a second hole exposing the head portion of the gate, and filling the first and the second holes with a conductive material. The head portion may vertically overlap the active portion.

BRIEF DESCRIPTION OF THE DRAWINGS

The above and other features and advantages of the present invention will become more apparent to those of ordinary skill in the art by describing in detail exemplary embodiments thereof with reference to the attached drawings, in which.

DETAILED DESCRIPTION OF THE INVENTION

Korean Patent Application No. 10-2007-0073347, filed on Jul. 23, 2007, in the Korean Intellectual Property Office, and entitled: "Semiconductor Device and Method of Manufacturing the Same," is incorporated by reference herein in its entirety.

Exemplary embodiments of the present invention will now be described more fully hereinafter with reference to the accompanying drawings, in which exemplary embodiments of the invention are illustrated. Aspects of the invention may, however, be embodied in different forms and should not be construed as limited to the embodiments set forth herein. Rather, these embodiments are provided so that this disclosure will be thorough and complete, and will fully convey the scope of the invention to those skilled in the art.

In the figures, the dimensions of elements, layers, and regions may be exaggerated for clarity of illustration. It will also be understood that when an element and/or layer is referred to as being "on" another element, layer and/or substrate, it can be directly on the other element, layer, and/or substrate, or intervening elements and/or layers may also be present. Further, it will be understood that the term "on" can indicate solely a vertical arrangement of one element and/or layer with respect to another element and/or layer, and may not indicate a vertical orientation, e.g., a horizontal orientation. In addition, it will also be understood that when an element and/or layer is referred to as being "between" two elements and/or layers, it can be the only element and/or layer between the two elements and/or layers, or one or more intervening elements and/or layers may also be present. Further, it will be understood that when an element and/or layer is referred to as being "connected to" or "coupled to" another element and/or layer, it can be directly connected or coupled to the other element and/or layer, or intervening elements and/or layers may be present. Like reference numerals refer to like elements throughout.

As used herein, the expressions "at least one," "one or more," and "and/or" are open-ended expressions that are both conjunctive and disjunctive in operation. For example, each of the expressions "at least one of A, B, and C," "at least one of A, B, or C," "one or more of A, B, and C," "one or more of A, B, or C" and "A, B, and/or C" includes the following meanings: A alone; B alone; C alone; both A and B together; both A and C together; both B and C together; and all three of A, B, and C together. Further, these expressions are open-ended, unless expressly designated to the contrary by their combination with the term "consisting of." For example, the expression "at least one of A, B, and C" may also include an nth member, where n is greater than 3, whereas the expression "at least one selected from the group consisting of A, B, and C" does not.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing exemplary embodiments only and is not intended to be limiting of the invention. As used herein, the singular forms "a", "an," and "the" are open terms that may be used in conjunction with singular items or with plural items.

Example embodiments of the invention are described herein with reference to cross-sectional illustrations that are schematic illustrations of idealized example embodiments (and intermediate structures) of the present invention. As such, variations from the shapes of the illustrations as a result, for example, of manufacturing techniques and/or tolerances, are to be expected. Thus, example embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be explained in detail with reference to the accompanying drawings.

Figure 1:
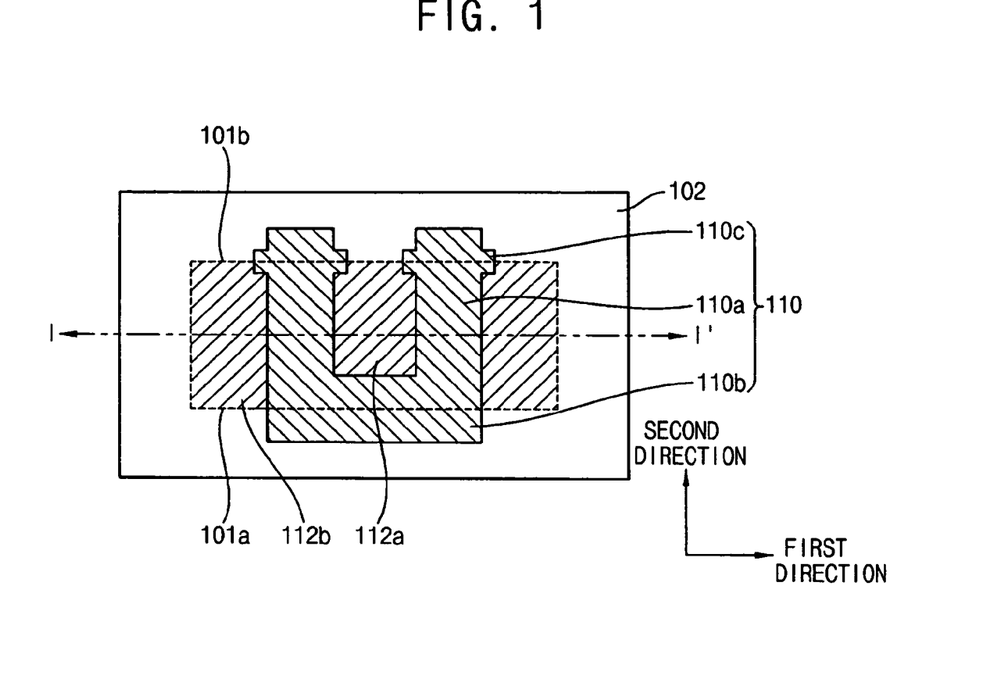
FIG. 1 illustrates a plan view of a semiconductor device in accordance with example embodiments of the present invention.
Figure 2:
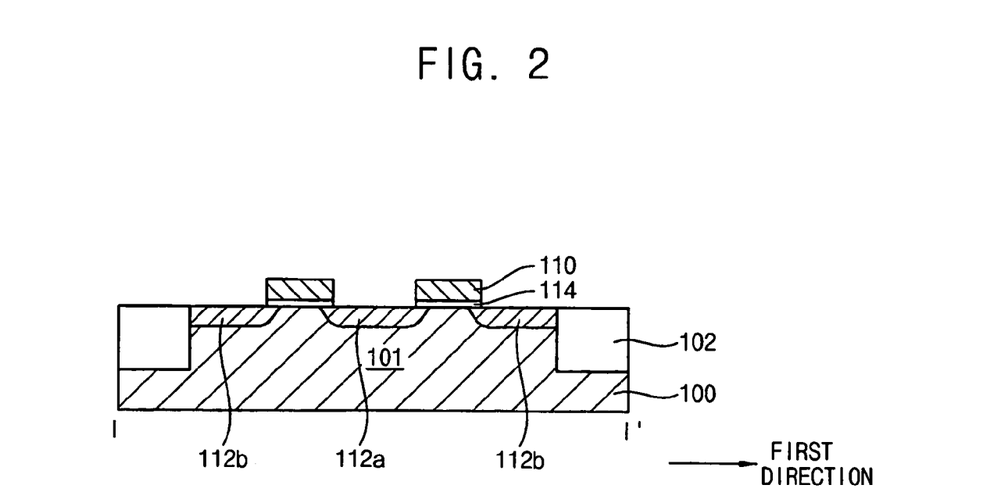
FIG. 2 illustrates a cross-sectional view along line I-I' in FIG. 1.

FIGS. 1-2 illustrate plan and cross-sectional views, respectively, of a semiconductor device in accordance with example embodiments of the present invention. Referring to FIGS. 1-2, a semiconductor device, e.g., a transistor, may include a semiconductor substrate 100, an active region 101 on the semiconductor substrate 100, and a gate 110 on the active region 101.

More particularly, as illustrated in FIG. 2, the active region 101 may be formed in the semiconductor substrate 100, so a portion of the semiconductor device 100 protruding along a vertical direction, i.e., orthogonally with respect to a plane formed by first and second directions, may define the active region 101. For example, as illustrated in FIG. 1, the active region 101 may have a rectangular cross-section in the plane formed by the first and second directions, so a longitudinal side of the active region 101 may extend along the first direction.

The active region 101 may include a first sidewall 101a and a second sidewall 101b facing the first sidewall 101a. The first and second sidewalls 101a and 101b may be parallel to each other, and may extend along the first direction. The first and second sidewalls 101a and 101b may be spaced apart from each other along the second direction, i.e., a direction substantially perpendicular to the first direction.

The active region 101 may be surrounded by an isolation layer 102, as illustrated in FIG. 1. More specifically, the isolation layer 102 may be formed on the semiconductor substrate 100 in peripheral regions thereof to define the active region 101. Accordingly, the active region 101 may protrude vertically with respect to portions of the semiconductor device 100 covered with the isolation device 102. In other words, an upper surface of the active region 101, i.e., a surface facing the gate 110, may be vertically higher than a lower surface of the isolation layer 102, i.e., an interface of the isolation layer 102 and the semiconductor substrate 100. The isolation layer 102 may include an insulating material, e.g., a silicon oxide.

The gate 110 of the semiconductor device may be formed on the active region 101, and may include a conductive material, e.g., polysilicon doped with impurities, a metal, and so forth. The gate 110 may include body portions 110a, a head portion 110b connecting the body portions 110a to each other, and tab portions 110c on each body portion 110a.

The body portions 110a of the gate 110 may extend along the second direction, and may be parallel to each other. The body portions 110a may be spaced apart from each other, so a space therebetween may extend along the first direction. The body portions 110a may overlap the active region 101. A width of the body portion 110 may be measured along the first direction.

The head portion 110b of the gate 110 may extend along the first direction to connect the body portions 110a to each other. For example, as illustrated in FIG. 1, the gate 110 may include two body portions 110a, and the head portion 110b may extend between the two body portions 110a to form an inverted Π, i.e., Greek character pi, cross section in the plane formed by the first and second directions. The head portion 110b may overlap a portion of the active region 101 and a portion of the isolation layer 102, so the head portion 110b may cover a portion of the first sidewall 101a. The head portion 110b may overlap the active region 101 and the first sidewall 101a along a vertical direction, i.e., the head portion 110 may be above the active region 101 along a direction orthogonal to a plane formed by the first and second directions, so the active region 101 may be between the head portion 110b and a lowermost surface of the semiconductor substrate 100.

The tab portions 110c of the gate 110 may protrude from sidewalls of the body portions 110a. More particularly, as illustrated in FIG. 1, a plurality of tab portions 110c may be formed in each body portion 110a to extend along the first direction and to cover a portion of the second sidewall 101b. For example, as illustrated in FIG. 1, two tab portions 110c may be formed on opposing sidewalls of each body portion 110a, so the two tab portions 110c may face each other and completely overlap each other along the first direction. In other words, as illustrated in FIG. 1, each body portion 110a with the two tab portions 100c protruding therefrom may be symmetrical with respect to a central axis crossing the body portion 110a along the second direction. It is noted, however, that other configurations of the tab portions 110c with respect to the body portion 110a, e.g., the tab portions 110c may be offset from each other along the second direction, are within the scope of the present invention. A width of the tab portions 110c along the second direction may be substantially smaller than a length of the body portions 110a along the second direction. Tab portions 110c of adjacent body portions 110a, i.e., tab portions 110c that face each other and are adjacent to each other, may be spaced apart from each other by a predetermined distance.

The semiconductor device may further include a gate insulation layer pattern 114 between the gate 110 and the active region 101, as illustrated in FIG. 2. The gate insulation layer pattern 114 may include an insulating material, e.g., a silicon oxide.

The semiconductor device may further include a first source/drain region 112a in an upper portion of the active region 101 between the body portions 110a, as illustrated in FIGS. 1-2. A portion of the first source/drain region 112a may be between tab portions 110c of adjacent body portions 110a, as illustrated in FIG. 1. A second source/drain region 112b may be formed in the upper portion of the active region 101 outside the gate 110, i.e., external to the gate 110. That is, as illustrated in FIGS. 1-2, one body portion 110a may be between the first source/drain region 112a and the second source/drain region 112b. The first and second source/drain regions 112a and 112b may be formed by implanting impurities onto the active region 101.

Figure 3:
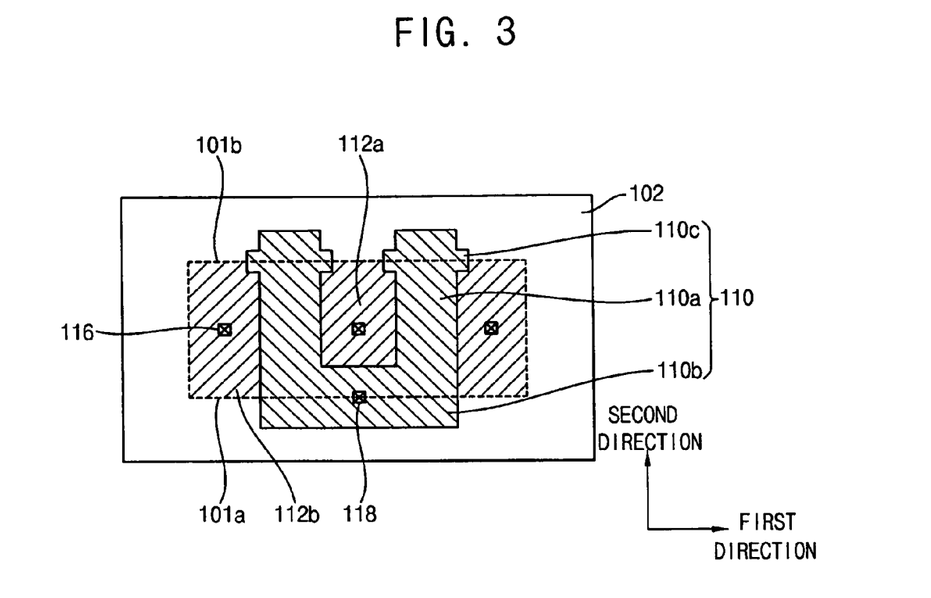
FIG. 3 illustrates a plan view of contacts in the semiconductor device of FIG. 1.

The semiconductor device may further include contacts, as illustrated in FIG. 3. More particular, referring to FIG. 3, first contacts 116 may be formed on the first and second source/drain regions 112a and 112b, and a second contact 118 may be formed on the head portion 110b of the gate 110.

Hereinafter, a method of manufacturing the semiconductor device in FIG. 1 will be described. FIGS. 4, 6, 8, and 10 illustrate plan views of sequential stages in a method of manufacturing the semiconductor device in FIG. 1. FIG. 5 illustrates a cross-sectional view along line I-I' in FIG. 4. FIG. 7 illustrates a cross-sectional view along line I-I' in FIG. 6. FIG. 9 illustrates a cross-sectional view along line I-I' in FIG. 8. FIG. 11 illustrates a cross-sectional view along line I-I' in FIG. 10.

Figure 4:
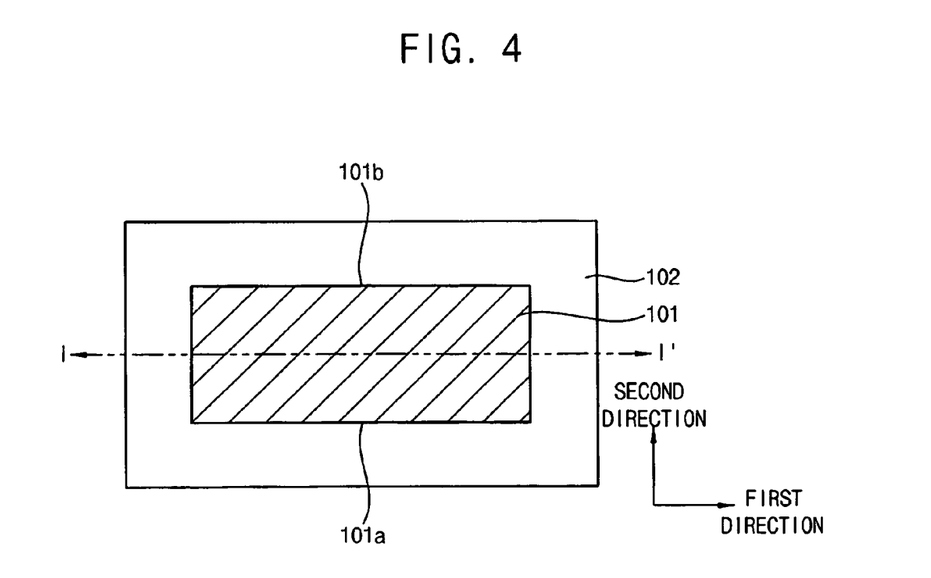
FIGS. 4, 6, 8 and 10 illustrate plan views of sequential stages in a method of manufacturing the semiconductor device of FIG. 1.
Figure 5:
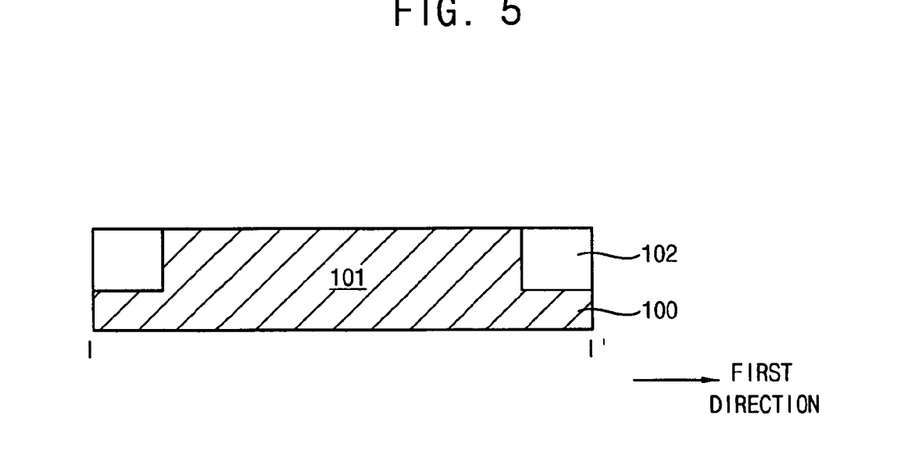
FIGS. 5, 7, 9, and 11 illustrate cross-sectional views along line I-I' in FIGS. 4, 6, 8, and 10, respectively.

Referring to FIGS. 4-5, the semiconductor substrate 100, e.g., a silicon wafer, may be provided. The isolation layer 102 including an insulating material, e.g., a silicon oxide, may be formed on the semiconductor substrate 100 by an isolation process, e.g., a shallow trench isolation (STI) process. The isolation layer 102 may define a portion of the semiconductor substrate 100 as the active region 101. The active region 101 may protrude from the semiconductor substrate 100, i.e., relative to portions of substrate covered by the isolation layer 102. Accordingly, the active region 101 may be formed by, e.g., the STI process, and may be surrounded by the isolation layer 102. The active region 101 may extend in the first direction, and may include first and second sidewalls 101a and 101b as described previously with reference to FIGS. 1-2.

Figure 6:
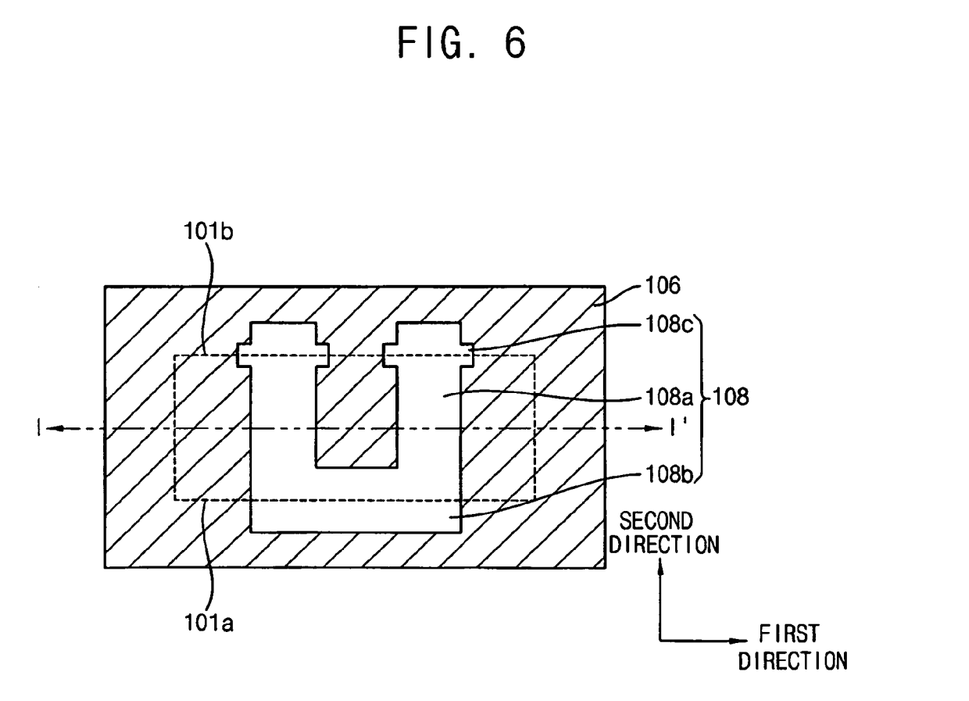
Figure 7:
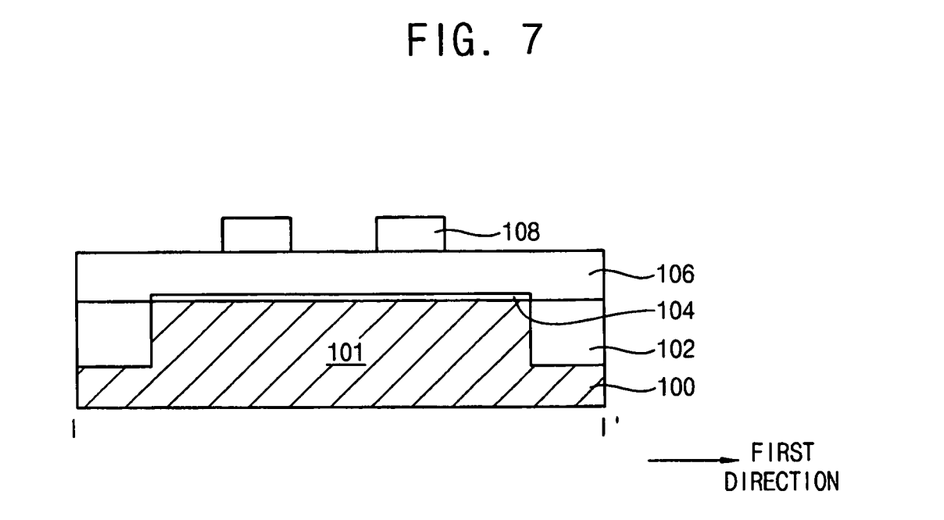

Referring to FIGS. 6-7, a gate insulation layer 104 may be formed on the active region 101. For example, the gate insulation layer 104 may be formed by a thermal oxidation process, so a top surface of the active region 101 may be oxidized to form the gate insulation layer 104.

A gate conductive layer 106 having a predetermined thickness may be formed on an entire top surface of the semiconductor substrate 100. In other words, as illustrated in FIG. 7, the gate conductive layer 106 may be formed to cover the gate insulation layer 104 and the isolation layer 102. The gate conductive layer 106 may be formed using a conductive material, e.g., a metal or doped polysilicon.

A mask 108 may be formed on the gate conductive layer 106, e.g., by a photolithography process. The mask 108 may include first portions 108a, a second portion 108b, and third portions 108c. The first portions 108a, second portion 108b, and third portions 108c may be formed integrally, and may correspond to the body portions 110a, head portion 110b, and tab portions 110c, respectively.

More particularly, the first portions 108a of the mask 108 may be spaced apart from each other, and may extend in the second direction in parallel with each other. The second portion 108b of the mask 108 may extend in the first direction to connect the first portions 108a, and may cover a portion of the first sidewall 101a of the active region 101 along a vertical direction. Each of the third portions 108c of the mask 108 may protrude from a sidewall of each of the first portions 108a, and may extend in the first direction to cover a portion of the second sidewall 101b of the active region 101 along a vertical direction.

For example, a photoresist layer may be formed on the gate conductive layer 106. The photoresist layer may be processed via a soft-bake process to evaporate a solvent from the photoresist layer, so the photoresist layer may be hardened, followed by an exposure and development processes. For example, a krypton fluoride (KrF) laser, an argon fluoride (ArF) laser, and a fluorine ($F_2$) laser may be used as illumination light during the exposure process. The mask 108 may be finalized via, e.g., a post-bake process for hardening the mask 108.

Formation of the mask 108 by a photolithography process according to embodiments of the present invention may minimize width inconsistencies of edges of the mask 108. In particular, the mask 108 may include the third portions 108c protruding at edges of the first portions 108a along the first direction. Since the third portions 108c overlap the second sidewall 101b of the active region 101 and protrude from both sidewalls of each of the first portions 108a, the third portions 108c may compensate for a width reduction of the edge portions of the first portions 108a during formation thereof. Therefore, a width of edges of the first portions 108a along the first direction may be adjusted. Further, widths of edge portions of the first portions 108a overlapping the first sidewall 101a of the active region 101 may not be reduced when formed by a photolithography process, because the first portions 108a may be connected to each other by the second portion 108b extending in the first direction. Since the second portion 108b may prevent or substantially minimize width reduction of edges of the first portions 108a overlapping the first sidewall 101a of the active region 101, the third portions 108c may not be required at portions vertically corresponding to the first sidewall 101a of the active region 101.

Figure 8:
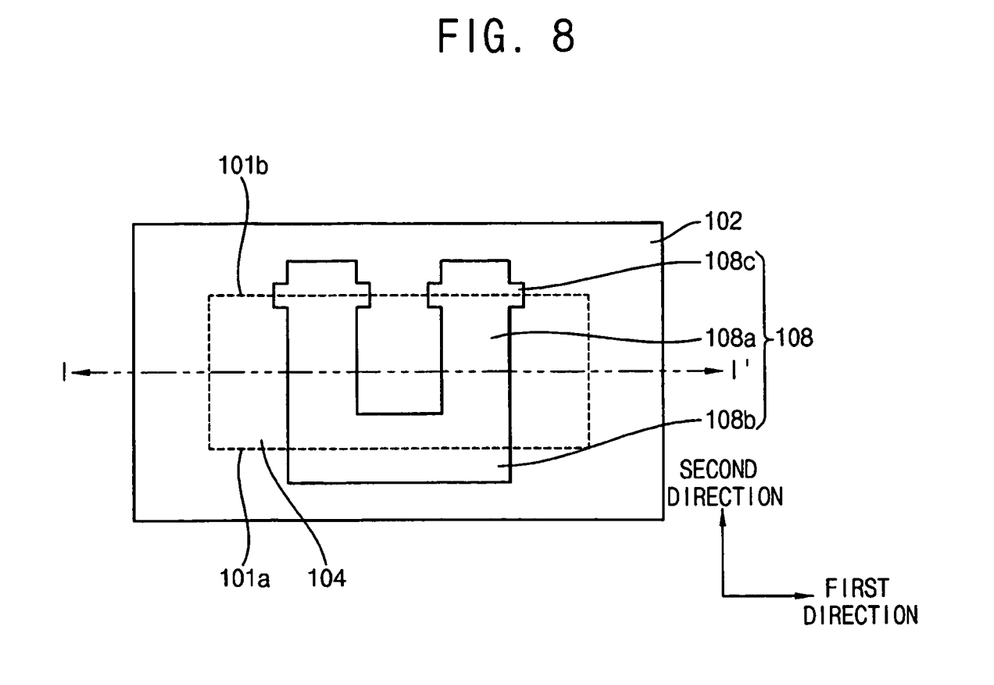
Figure 9:
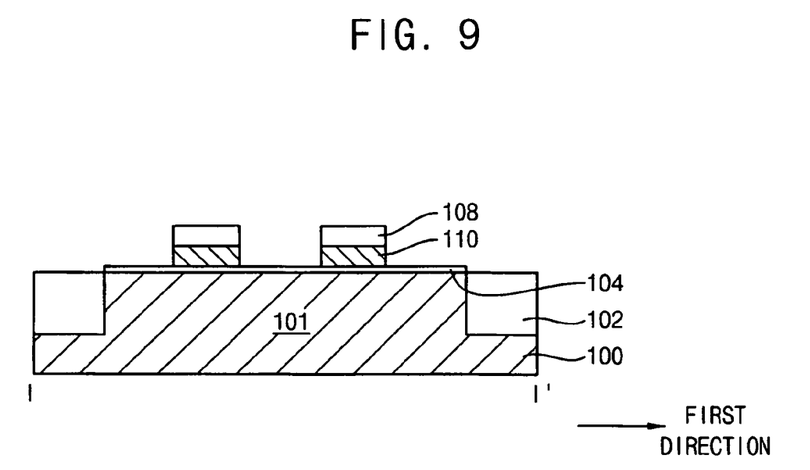

Referring to FIGS. 8-9, the gate conductive layer 106 may be etched using the mask 108 as an etching mask to form the gate 110. Removal of portions of the gate conductive layer 106 not covered by the mask 108 may expose portions of the gate insulation layer 104 and the isolation layer 102. The gate 110 may have a substantially same shape as the mask 108 because the gate 110 is formed by an etching process using the mask 108 as an etching mask. Accordingly, since edges of the mask 108 may have a proper width, i.e., widths of edges thereof may not be formed smaller than their corresponding expected values, widths of edges of the gate 110 may not be minimized. Any suitable etching process may be used, e.g., ion etching. An etch-back process or a chemical mechanical polishing (CMP) process may be further used for planarizing the gate 110, followed by, e.g., a drying process and a cleaning process for removing contaminants from the semiconductor substrate.

Figure 10:
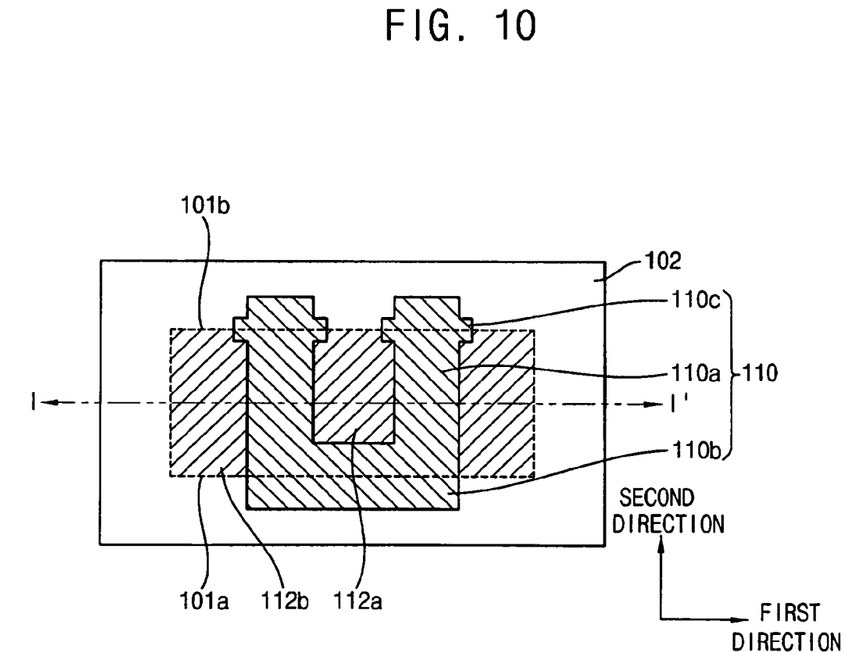
Figure 11:
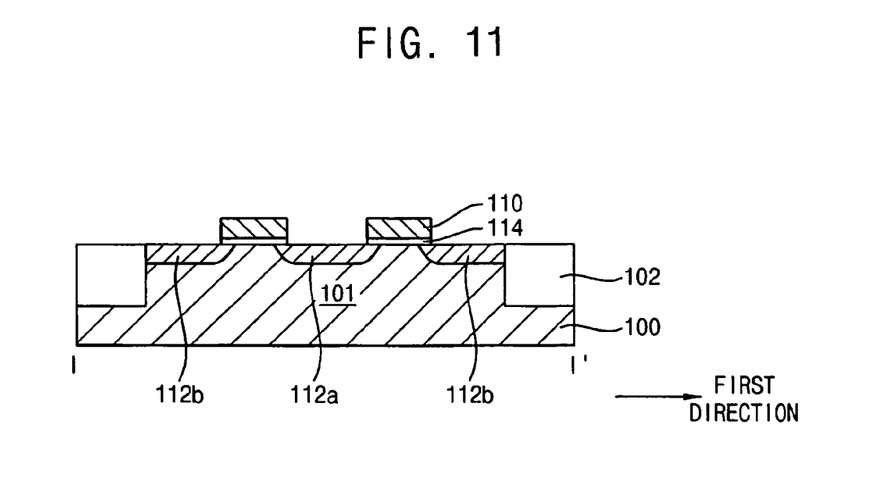

Referring to FIGS. 10-11, ions may be implanted onto the active region 101 using the mask 108 as an ion implantation mask. The gate insulation layer 104 may prevent or substantially minimize the active region 101 from being damaged when the ions are implanted into the active region 101. The first source/drain region 112a may be formed at an upper portion of the active region 101 surrounded by the pair of the first portions 108a and the second portion 108b. The second source/drain region 112b may be formed at an upper portion of the active region 101 outside the gate 110, so the second source/drain region 112b may be between the gate 110 and the isolation layer 102.

The gate insulation layer 104 may be etched using the mask as an etching mask, thereby forming a gate insulation layer pattern 114 beneath the gate 110. Next, the mask 108 may be removed to expose the gate 110. The gate 110 may have a substantially same shape as the mask 108. That is, the gate 110 may include the body portions 110a, head portion 110b, and tab portions 110c as described previously with reference to FIGS. 1-2. As described previously with reference to the third portions 108c of the mask 108, the tab portions 110c of the gate 110 may compensate for a width reduction of edge portions of the body portions 110a because the tab portions 110c may protrude from both sidewalls of each of the body portions 110a at a portion vertically corresponding to the second sidewall 101b of the active region 101. Thus, leakage current may be substantially reduced and resistance to a punch-through phenomenon due to hot carrier electrons may be increased.

Additionally, the gate 110 may have a sufficient width at edge portions of the body portions 110a corresponding to the first sidewall 101a of the active region 101 due to the head portion 110b, so formation of the tab portions 110c to overlap the first sidewall 101 may not be required. That is, the tab portions 110c compensating the reduction of the width of edge portions of the body portions 110a may not be formed because formation of the head portion 110b may prevent or substantially minimize a decrease of width of the edge portions of the body portions 110a. Thus, a process for forming the gate 110 may become relatively simple, and a semiconductor device having a high degree of integration and improved operability and reliability may be produced.

Formation of contacts in the semiconductor device will be described with reference to FIG. 12.

Figure 12:
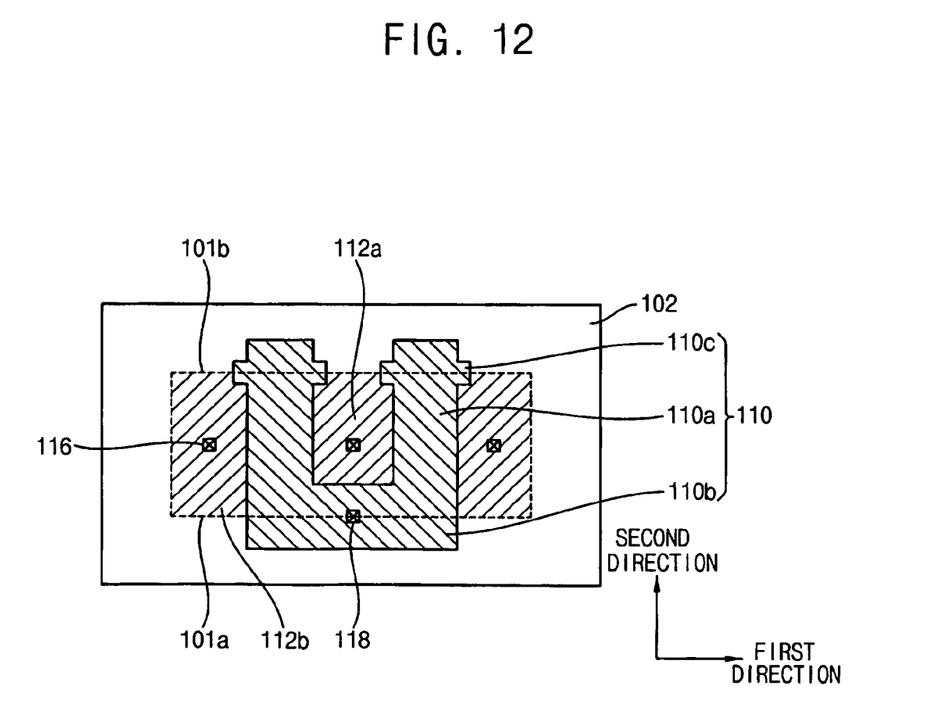
FIG. 12 illustrates a plan view of a method of forming contacts in the semiconductor device of FIG. 3.

As illustrated in FIG. 12, an insulation layer may be formed on the active region 101 and the isolation layer 102 to cover the first source/drain region 112a, the second source/drain region 112b, and the gate 110. First holes partially exposing the first source/drain region 112a and the second source/drain region 112b, respectively, and a second hole partially exposing the gate 110 may be formed through the insulation layer. The first and second holes may be filled with a conductive material to form the first contact 116 and the second contact 118. The first and the second contacts 116 and 118 may be formed by a substantially same process.

According to some example embodiments of the present invention, a gate may include a body portion, a head portion, and a tab portion. The tab portion may reduce leakage current generated when the width of an edge portion of the body portion is decreased, and may improve resistance to a punch-through phenomenon due to hot carrier electrons. Also, formation of the tab portion may not be required at a portion of the gate on which the head portion is formed because the gate may have a sufficient gate width due to the head portion. Accordingly, a process for forming the gate becomes simple, and a semiconductor device having a high degree of integration may be easily manufactured.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A semiconductor device, comprising:
an active region extending along a first direction on a semiconductor substrate, the active region having a first sidewall and a second sidewall spaced apart and facing each other, a distance between the first and second sidewalls extending along a second direction; and
a gate on the active region, the gate including,
a pair of body portions extending along the second direction and being spaced apart from each other, the second direction being perpendicular to the first direction;
a head portion extending along the first direction to connect the body portions, the head portion overlapping a portion of the first sidewall; and
a plurality of tab portions protruding from sidewalls of the body portions, the tab portions extending along the first direction and overlapping a portion of the second sidewall.

2. The semiconductor device as claimed in claim 1, wherein the head portion overlaps the active region.

3. The semiconductor device as claimed in claim 1, further comprising a gate insulation layer pattern between the active region and the gate.

4. The semiconductor device as claimed in claim 1, further comprising first and second source/drain regions at an upper portion of the active region, the first source/drain region being between the pair of the body portions, and the second source/drain region being adjacent to an isolation layer surrounding the active region.

5. The semiconductor device as claimed in claim 4, further comprising first contacts on the first and second source/drain regions and a second contact on the head portion of the gate.

6. The semiconductor device as claimed in claim 1, wherein two tab portions protrude from each body portion, the two tab portions being positioned on opposing sidewalls of the body portion.

7. The semiconductor device as claimed in claim 6, wherein each body portion with the two tab portions is symmetrical about a central axis crossing the body portion along the second direction.

* * * * *